US009935416B2

(12) United States Patent
Kang

(10) Patent No.: US 9,935,416 B2

(45) Date of Patent: Apr. 3, 2018

(54) METHOD FOR OPERATING A CONNECTOR MODULE ASSEMBLY

(71) Applicant: ROCKWELL AUTOMATION ASIA PACIFIC BUSINESS CENTER PTE. LTD., Singapore (SG)

(72) Inventor: Soon Seng Kang, Singapore (SG)

(73) Assignee: Rockwell Automation Asia Pacific Business Center Pte. Ltd., Singapore (SG)

( * ) Notice: Subject to any disclaimer, the term of this patent is extended or adjusted under 35 U.S.C. 154(b) by 394 days.

(21) Appl. No.: 14/320,257

(22) Filed: Jun. 30, 2014

(65) Prior Publication Data

US 2014/0310956 A1 Oct. 23, 2014

Related U.S. Application Data

(62) Division of application No. 13/222,466, filed on Aug. 31, 2011, now Pat. No. 8,784,120.

(30) Foreign Application Priority Data

Sep. 6, 2010 (SG) ............................. 201006468-1

(51) Int. Cl.

*H05K 7/20* (2006.01)
*H01R 43/20* (2006.01)
(Continued)

(52) U.S. Cl.

CPC ....... *H01R 43/205* (2013.01); *H01R 12/7011* (2013.01); *H01R 13/6658* (2013.01); *Y10T 29/49147* (2015.01)

(58) Field of Classification Search

CPC ........... H01R 12/7011; H01R 13/6658; H01R 43/205; Y10T 29/49147

See application file for complete search history.

(56) References Cited

U.S. PATENT DOCUMENTS 3,500,131 A * 3/1970 Schlasser, Jr. ....... H05K 7/1434 174/564

5,593,319 A 1/1997 Ohno (Continued)

OTHER PUBLICATIONS

Yu, Linpo et al., "Electro-reduction of cuprous chloride powder to copper nanoparticles in an ionic liquid," Electrochemistry Communications 9, pp. 1374-1381, Feb. 3, 2007.

(Continued)

*Primary Examiner* — Minh Trinh

(74) *Attorney, Agent, or Firm* — Fletcher Yoder, P.C.

(57) ABSTRACT

A method of assembling a connector module is provided. The method of assembling includes abutting an engagement surface of a connector extending from a circuit board with corresponding engagement surfaces of first and second support members disposed within a housing. The method of assembling includes resisting movement of the connector towards a base of the housing at a first end of the connector through a substantially perpendicular extension from at least one of the first and second support members. The method of assembling includes constraining lateral movement of the connector through engaging a receptacle formed on a second end of the connector with a pin of the first support member.

10 Claims, 5 Drawing Sheets

(51) Int. Cl.
*H01R 12/70* (2011.01)
*H01R 13/66* (2006.01)

(56) References Cited

U.S. PATENT DOCUMENTS

| | | | | |
|---|---|---|---|---|
| 5,689,405 | A * | 11/1997 | Bethurum | H05K 5/0269 361/737 |
| 5,761,046 | A | 6/1998 | Hein et al. | |
| 5,784,263 | A * | 7/1998 | Nelson | H01R 12/721 361/748 |
| 5,872,333 | A | 2/1999 | Uezono et al. | |
| 6,005,775 | A | 12/1999 | Chiu | |
| 6,064,575 | A * | 5/2000 | Urda | H05K 7/1461 165/185 |
| 6,169,654 | B1 | 1/2001 | Krusel et al. | |
| 6,249,438 | B1 | 6/2001 | Thomas et al. | |
| 7,090,509 | B1 * | 8/2006 | Gilliland | G02B 6/4292 385/92 |
| 7,530,165 | B2 * | 5/2009 | Mongold | H01R 12/57 29/825 |
| 8,784,120 | B2 * | 7/2014 | Kang | H01R 12/7011 439/76.1 |
| 2005/0048850 | A1 | 3/2005 | Zoller | |
| 2005/0207128 | A1 * | 9/2005 | Quijano | G06F 1/181 361/752 |
| 2012/0057319 | A1 * | 3/2012 | Kang | H05K 7/1468 361/759 |
| 2012/0309233 | A1 * | 12/2012 | O'Malley | H01R 13/6469 439/626 |

OTHER PUBLICATIONS

Search Report & Written Opinion for Singapore Application No. 201006468-1 dated Mar. 19, 2012.

Office Action for Chinese Application No. 201110263332.5 dated Feb. 7, 2014.

* cited by examiner

METHOD FOR OPERATING A CONNECTOR MODULE ASSEMBLY

CROSS-REFERENCE TO RELATED APPLICATIONS

This application is a division of U.S. patent application Ser. No. 13/222,466, filed Aug. 31, 2011, which claims priority from and the benefit of Singapore Patent Application No. 2010064681, filed Sep. 6, 2010; entitled "Connector Support System." The disclosures of U.S. patent application Ser. No. 13/222,466 and Singapore Patent Application No. 2010064681 are each incorporated herein by reference in their entirety.

BACKGROUND

The invention relates generally to printed circuit boards, such as those used in components of industrial automation and control systems. More particularly, embodiments of the present invention relate to techniques for securing a connector of a printed circuit board.

Industrial automation and control systems are known and are in use for controlling factory automation and the like. Such systems include various components such as programmable logic controllers, semiconductor power electronic circuits, power supplies, motor starters, relays, and so forth that are utilized to monitor and control a process/system. Typically, the programmable logic controller examines a series of inputs reflecting the status of a controlled process and changes outputs affecting control of the controlled process.

In general, components such as programmable logic controllers, input/output modules, and the like often utilize a number of printed circuit boards. Typically, these boards include power modules which house electrical devices such as resistors and semiconductors, logic or customer interface circuit boards (e.g., motherboards) which house microprocessors or other logic devices for performing control functions, and storage or capacitor circuit boards which house charge storage devices and direct current (DC) power busses. Each of the circuit boards supports components and conducting paths for accomplishing various functions in the completed device.

In traditional automation and control systems, various components, such as controllers and input/output modules include a printed circuit board coupled with a connector within a housing. The connector (e.g., a pin connector) is configured to couple with a removable terminal block to facilitate communication with other devices via the removable terminal block. The connector is typically soldered onto the printed circuit board such that the connector is cantilevered from a top portion of the printed circuit board. Further, the printed circuit board and the connector are typically arranged such that the removable terminal block can be inserted through an opening in a top of housing to engage a receptacle of the connector.

BRIEF DESCRIPTION

According to one embodiment of the present invention, a connector support system for an automation system device is provided. The connector support system includes a device housing configured to hold a printed circuit board with a connector coupled to the printed circuit board. The connector support system also includes one or more support members coupled to a surface of the housing, wherein the one or more support members are configured to support the connector relative to the housing and configured to resist an overturning force or moment tending to remove the connector from the printed circuit board.

In accordance with another aspect, an electronic device is provided. The electronic device includes a housing, a printed circuit board disposed within the housing and a connector coupled to the printed circuit board. The electronic device also includes a support member disposed within the housing, wherein the support member comprises a beam extending along a length of the housing substantially parallel to the printed circuit board, and wherein an engagement feature of the beam engages the connector such that movement of the connector toward the support member is resisted by the support member.

In accordance with another aspect, a method of operation is provided. The method includes abutting an engagement surface of a connector extending from a circuit board with corresponding engagement surfaces of first and second support members disposed within a housing and resisting movement of the connector towards a base of the housing at a first end of the connector through a substantially perpendicular extension from one of the two support members. The method also includes constraining lateral movement of the second support member through engaging a receptacle formed on a second end of the connector with a pin of the second support member.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In a typical automation component housing that includes a printed circuit board, a connector for facilitating a communicative coupling between a removable terminal block and the printed circuit board is typically cantilevered from an upper portion of the printed circuit board. More specifically, the connector is typically positioned such that the removable terminal block can be inserted through an opening in a top of the housing and pressed into engagement with a receptacle of the connector by pressing the removable terminal block down on the connector. The connector is typically soldered onto the printed circuit board and it is now recognized that pressing down on the removable terminal block to engage it with the connector can impart an overturning force or load that breaks the connector away from the printed circuit board. Accordingly, it is now recognized that it is desirable to develop a connector support system for supporting the connector of a printed circuit board that resists forces tending to remove the connector from the printed circuit board during installation of the removable terminal block.

As discussed in detail below, embodiments of the present technique function to provide a connector support system for supporting a connector of a printed circuit board of an electronic device such as employed in industrial control and automation systems. The present techniques provide support members that resist overturning moments or forces while facilitating easy assembly of the components of the electronic device. For example, present embodiments include support members that extend from a device housing or a printed circuit board and engage with aspects of the connector in a manner that supports the connector against forces imparted during engagement of the connector with a removable terminal block or the like. Further, present embodiments may avoid the use of fasteners such as screws to resist the overturning loads experienced by the connector. It is now recognized that such fasteners can be cumbersome, delicate, and expensive.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
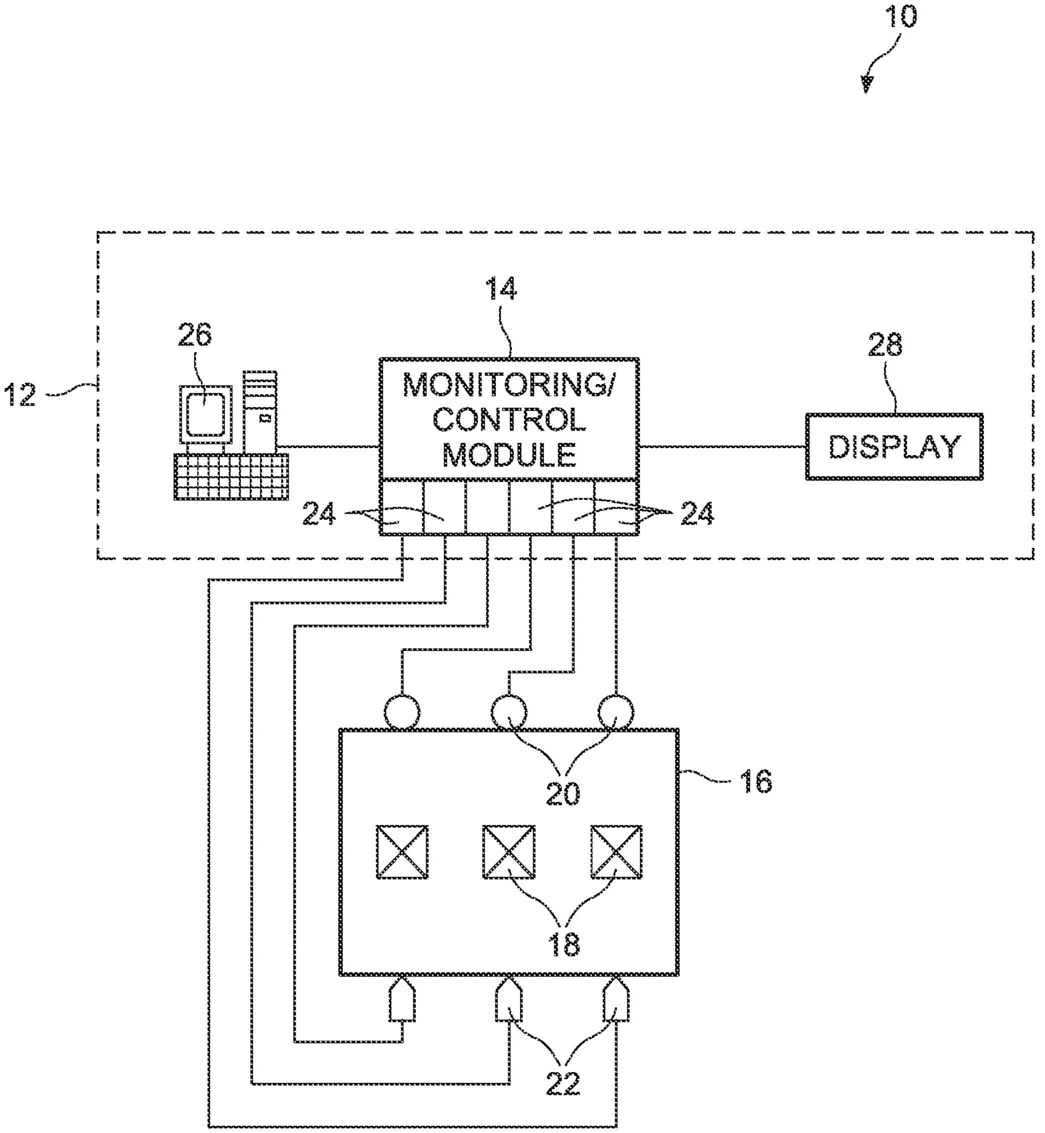
FIG. 1 is a block diagram that illustrates an exemplary industrial automation and control system including a module in accordance with aspects of the present technique.

Turning now to the drawings and referring first to FIG. 1 an exemplary industrial automation and control system 10 is illustrated. The system 10 includes an enclosure 12, such as an electrical cabinet, in which electrical components such as monitoring and/or control components are housed. Example components in the unit may include relays, motor starters, and programmable logic controllers (PLC), among others.

The enclosure 12 may be suitable, for example, for assembly of a motor control center or use with industrial, commercial, marine, or other electrical systems. The enclosure 12 may be made of any suitable material, such as heavy gage sheet metal, reinforced plastics, and so forth. In certain embodiments, the enclosure 12 includes individual compartments or other structures that support the electrical components.

In the illustrated embodiment, the system 10 includes a monitoring/control module 14 assembled in accordance with present techniques and adapted to interface with components of a machine system/process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process/system 16 may take many forms and include devices for accomplishing many different and varied purposes. For example, the process/system 16 may comprise a compressor station, an oil refinery, a batch operation for making food items, a mechanized assembly line, and so forth. Accordingly, the process/system 16 may comprise a variety of operational components generally represented by reference numeral 18, such as electric motors, valves, actuators, temperature elements, pressure sensors, or a myriad of manufacturing, processing, material handling and other applications.

Further, the process/system 16 may comprise control and monitoring equipment for regulating process variables through automation and/or observation. For example, the illustrated process/system 16 comprises sensors 20 and actuators 22. The sensors 20 may comprise any number of devices adapted to provide information regarding process conditions. The actuators 22 may include any number of devices adapted to perform a mechanical action in response to an input signal.

As illustrated, these sensors 20 and actuators 22 are in communication with the monitoring/control module 14 (e.g., a programmable logic controller). In one embodiment, the sensors 20 and actuators 22 may communicate with the monitoring/control module 14 via one or more input/output (I/O) modules 24 coupled to the monitoring/control module 14. The I/O modules 24 may transfer input and output signals between the monitoring/control module 14 and the controlled process/system 16.

In certain embodiments, these devices (sensors 20 and actuators 22) may be utilized to operate process equipment. Indeed, they may be utilized within process loops that are monitored and controlled by the process/system 16. Such a process loop may be activated based on process inputs (e.g., input from a sensor 20) or direct operator input received through a user interface device 26.

The I/O modules 24 may be integrated with the control/monitoring device 14, or may be added or removed via expansion slots, bays or other suitable mechanism. For example, to add functionality to the control/monitoring device 14, additional I/O modules 24 may be added, such as if new sensors 20 or actuators 22 are added to control the process/system 16. These I/O modules serve as an electrical interface to the controller and may be located proximate or remote from the controller including remote network interfaces to associated systems.

The I/O modules 24 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O modules 24 may convert between AC and DC analog signals used by devices on a controlled machine or process and +5-volt DC logic signals used by the controller. Additionally, some of the I/O modules 24 may provide digital signals to digital I/O devices and receive digital signals from digital I/O devices. Further, in some embodiments, the I/O modules 24 that are used to control motion devices or process control devices may include local microcomputing capability on the I/O module 24.

In some embodiments, the I/O modules 24 may be located in close proximity to a portion of the control equipment, and away from the remainder of the controller. Data is communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet, or other network protocols (Foundation Fieldbus (H1 and Fast Ethernet) Modbus TCP, Profibus) and can also communicate to higher level computing systems.

In the illustrated embodiment, the system 10 also includes a display 28 such as an LCD or other display. The display 28 is configured to display output parameters such as operating parameters of the process/system 10, temperature and pressures sensed by the sensors 20, position information of the actuators 22 and so forth.

In the illustrated embodiment, the individual modules such as the monitoring/control module 14 and the input/output modules 24 include printed circuit boards that include microprocessors or other logic devices configured to perform control and other desired functions. Each printed circuit board is connected to a connector with a connector support system in accordance with present techniques. The connector support system includes one or more support members disposed within a housing of the monitoring/control modules that resist movement of the connector as will be described below with reference to FIGS. 2-7.

Figure 3:
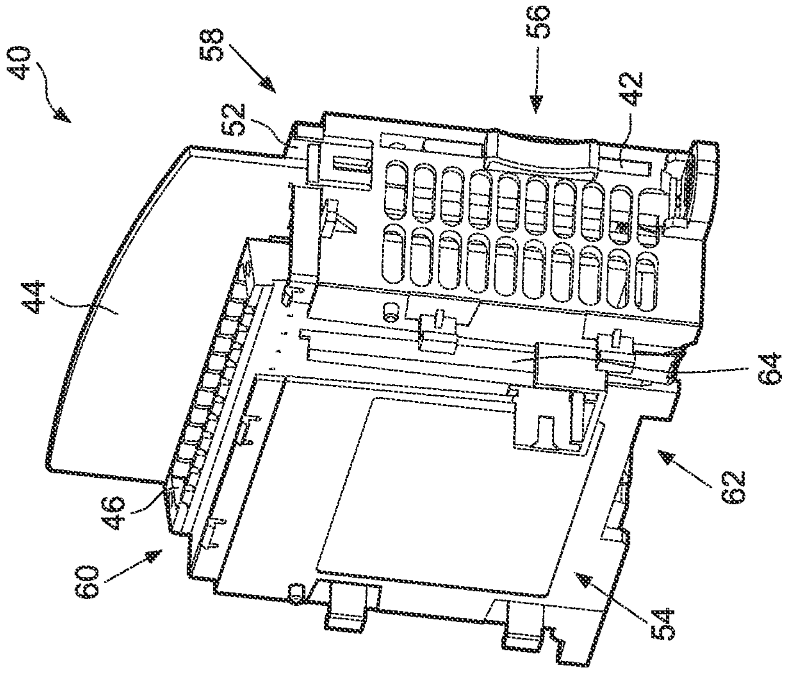
FIG. 3 is another perspective view of the module of FIG. 2 with portions of the module removed to illustrate components disposed within the module in accordance with aspects of the present technique.
Figure 2:
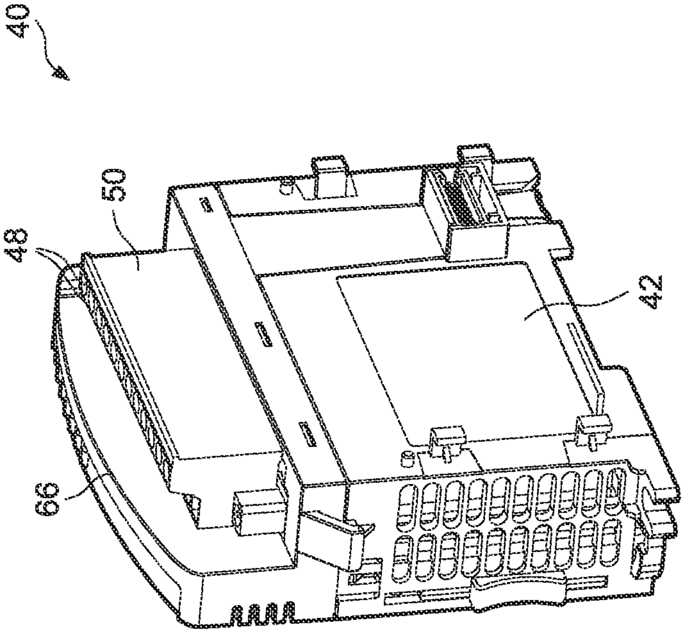
FIG. 2 illustrates a perspective view of an assembled individual module in accordance with aspects of the present technique.

FIG. 2 illustrates an assembled perspective view of an individual module 40 such as the monitoring/control module 14 of FIG. 1. Similarly, FIG. 3 is a view of the module 40 from a different perspective with portions of the module 40 removed to illustrate certain components disposed within the module 40. As illustrated in FIGS. 2 and 3, the module 40 includes a device housing 42 configured to hold a printed circuit board 44 (e.g., a motherboard) with a connector 46 coupled to the printed circuit board 44. The printed circuit board 44 may include electrical devices such as resistors and semiconductors. Further, for example, the printed circuit board 44 may include logic or customer interface circuit boards, which include microprocessors or other logic devices for performing control and/or monitoring functions.

The connector 46 is configured to facilitate signal transmission between electrical components of the module 40. Specifically, in the illustrated embodiment, the connector 46 is configured to facilitate communication between components on the circuit board 44 and terminal ports 48 of a removable terminal block 50, and to facilitate securing of the printed circuit board 44 within the device housing 42.

As can be seen, the device housing 42 includes a cavity 52 formed by four side walls generally represented by reference numerals 54, 56, 58 and 60 and a base 62. The cavity 52 is configured to slideably receive the printed circuit board 44 with the connector 46 at least partially into the cavity 52 through an opening in a top of the housing 42. It should be noted that the connector 46 is cantilevered from a side of the printed circuit board 44 near a top portion of the printed circuit board 44 and near the opening in the top of the housing 42. This positioning of the connector 46 facilitates access to the connector 46 through an opening in the top of the housing 42 for insertion of the removable terminal block 50 and engagement of the removable terminal block 50 with the connector 46.

As illustrated, in addition to the connector 46 being cantilevered from a side of the printed circuit board 44, it is also supported by one or more support members, such as support member 64, extending from the device housing 42. In the illustrated embodiment, the support member 64 extends from an interior surface of the base 62 and is substantially parallel to the printed circuit board 44. The support member 64 is configured to support the connector 46 relative to the device housing 42 and is configured to resist an overturning moment associated with coupling the removable terminal block 50 with the connector 46. Unchecked by the support member 64, the overturning moment may tend to remove the connector 46 from the printed circuit board 44.

In some embodiments, support members may extend from different surfaces or multiple surfaces of the device housing 42. Further, in some embodiments, one or more support members may extend from the connector 46 and engage a feature of the device housing 42, or one or more support members may extend from a lower portion of the printed circuit board 44 and engage the connector 46. It should be noted that when the printed circuit board 44 and the connector 46 are assembled within the device housing 42, as illustrated in FIG. 2, certain aspects of these support members are hidden from view. Accordingly, these attachment features are described in more detail below with reference to FIGS. 4-7. However, certain support features can be seen in FIG. 3.

The module 40 also includes a lid 66, as illustrated in FIG. 2. The lid 66 may be removed, as illustrated in FIG. 3, to create an opening in the top of the device housing 42 and to provide access to the cavity 52 and/or access to the connector 46. The lid 66 is configured to couple with the device housing 42 such that the lid 66 and the device housing 42 enclose the printed circuit board 44, the connector 46, and one or more support members (e.g., support member 64). The lid 66 includes an opening that enables connection of the removable terminal block 50 to the connector 46 when the lid 66 is in place. This aspect of the lid 66 is illustrated in FIG. 2, which shows the removable terminal block 50 positioned such that it is partially external to the lid 66 and coupled to the connector 46 within the device housing 42 via an opening in the lid 66. In other embodiments, a larger portion of the removable terminal block 50 may be enclosed while still providing access to the terminal ports 48.

Figure 5:
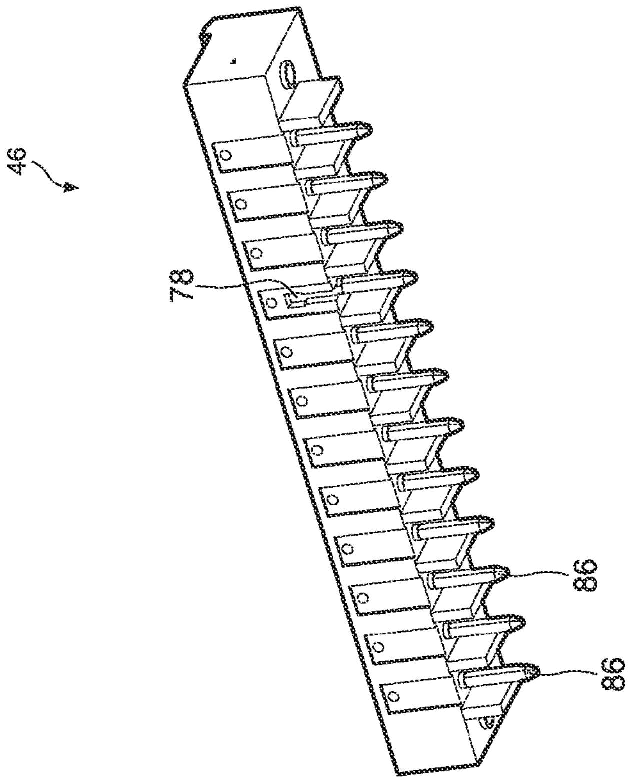
FIG. 5 illustrates exemplary attachment features of a connector of a module in accordance with aspects of the present technique.
Figure 4:
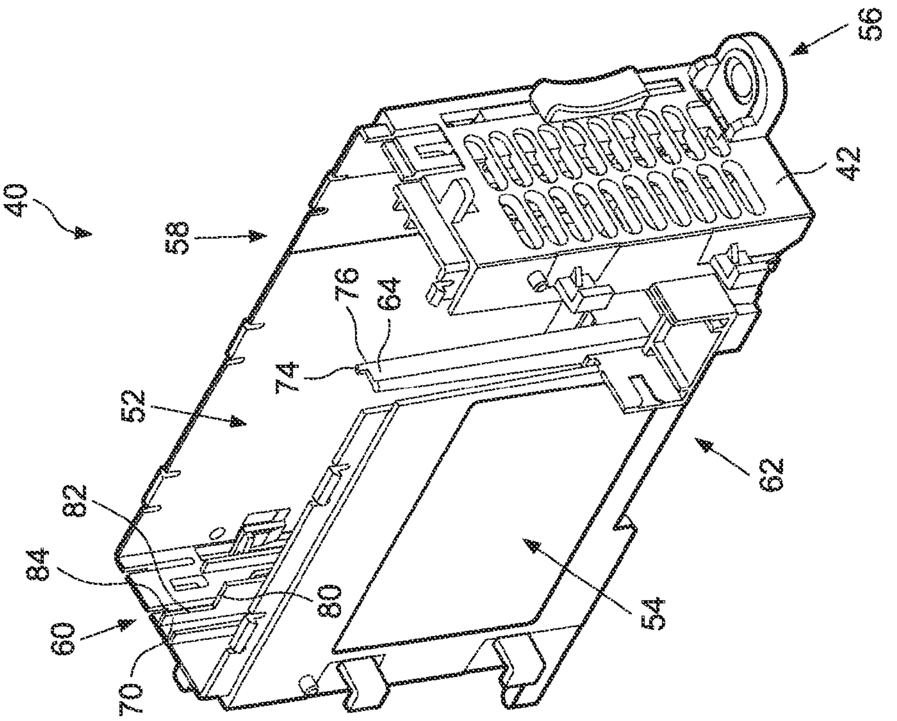
FIG. 4 is a perspective view of a module that illustrates an exemplary configuration of support members formed in a device housing for supporting a connector and a printed circuit board in accordance with aspects of the present technique.

FIGS. 4 and 5 illustrate support members of the device housing 42 and corresponding attachment features of the connector 46 of the module 40 of FIGS. 2 and 3. In this exemplary embodiment, the device housing 42 of the module 40 includes first and second support members, as indicated by reference numerals 64 and 70, respectively. In the illustrated embodiment, the first support member 64 and the second support member 70 each include beams extending within the device housing 42 from an interior surface of the device housing 42. As can be seen, the first support member 64 extends from an interior surface of the base 62 of the housing and the second support member 70 extends from the side surface 60 of the device housing 42 such that it forms a pair of ridges that combine to extend at least partially along a full height of the device housing 42. In this exemplary embodiment, the first support member 64 and the second support member 70 extend along the height of the device housing towards the opening at the top of the device housing 42 into the cavity 52, which is configured to receive the printed circuit board 44 and the connector 46.

In the illustrated embodiment, the first support member 64 includes a first attachment feature 74 formed on a distal end

76 of the support member 64. The first attachment feature 74 is configured to engage with a second attachment feature 78 of the connector 46, as illustrated in FIG. 5. In this example embodiment, the first attachment feature 74 includes a pin and the second attachment feature 78 includes a receptacle. Further, in the illustrated embodiment, the first support member 64 includes a beam having a pandurate cross-section. The pandurate cross-section provides a sufficient surface area of attachment to the base 62 to resist movement in different directions. Further, the illustrated first support member 64 is configured to provide sufficient structural support to resist forces typically applied downward on the first support member 64 associated with installation of the removable terminal block 50 into the connector 46 in accordance with present embodiments. However, while the illustrated embodiment includes the first support member 64 having a pandurate cross-section, in certain other embodiments, the first support member 64 may include an L-shaped cross-section or another cross-section type that provides support to the connector 46.

Further, in the illustrated embodiment, the second support member 70 includes a beam extending from an interior side of the side wall 60. The second support member 70 may also extend from an interior side of the base 62 to provide additional strength. An upper portion of the second support member 70 includes a horizontal extension 80 and a vertical extension 82 of a distal end 84 of the second support member 70. The respective edges of the horizontal extension 80 and the vertical extension 82 are configured to engage with and support the connector 46. For example, the edges of the horizontal extension 80 and the vertical extension 82 may engage a base and a side of the connector 46, respectively, and resist movement of the connector 46 during coupling of the connector with the removable terminal block 50. The parameters of the horizontal extension 80 and the vertical extension 82, such as width of the horizontal extension 80 and the height of the vertical extension 82, may be selected based upon the size of the connector 46.

In this exemplary embodiment, the device housing 42 includes two support members 64 and 70. However, in some embodiments, a greater or lesser number of such support members may be employed to support the connector 46 and to resist movement of the connector towards the base of the device housing 42. In this exemplary embodiment, the first and second support members 64 and 70 are integral with the device housing 42. In certain other embodiments, the first and second support members 64 and 70 may be individually pre-fabricated and coupled to one or more surfaces of the device housing 42 using an adhesive or a fastener. The first and second support members 64 and 70 are formed of materials such as nylon, polycarbonate, stainless steel, or combinations thereof. However, other suitable materials may be employed.

As illustrated in FIG. 5, the connector 46 includes a plurality of pins, as indicated by reference numeral 86. These pins 86 facilitate electrical connection with other components, such as the removable terminal block 50 (see FIG. 2) of the module 42. Further, the connector 46 is configured to couple with or engage the support members 64 and 70. Indeed, in this example embodiment, the connector 46 includes the receptacle 78, which is configured to receive the first attachment feature 74 of the first support member 64. In certain embodiments, the connector 46 may include other attachments mechanisms to engage the support members 64 and 70. For example, the connector 46 may include a pin configured to engage a receptacle at a distal end of the support member 64, a clasping mechanism or some other feature capable of engaging with the support member 64.

Figure 7:
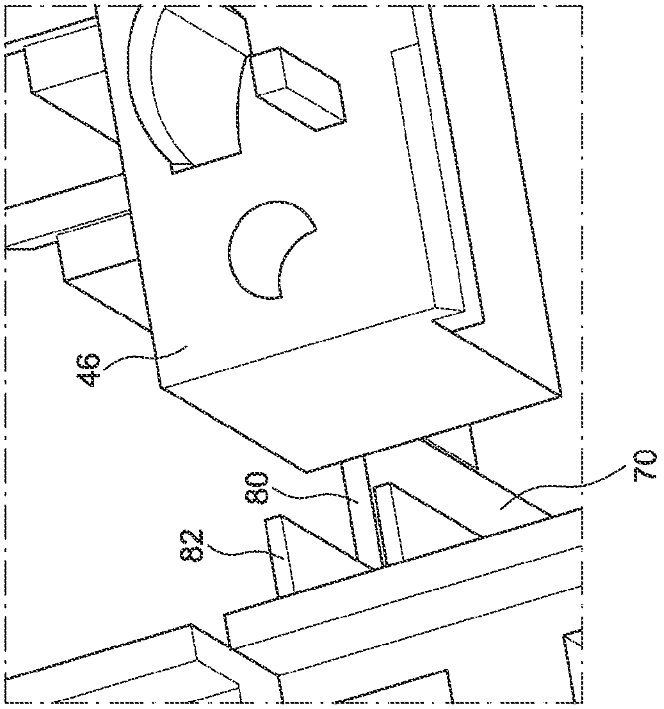
FIG. 7 illustrates engagement of the second support member of the device housing of FIG. 4 with the connector of FIG. 5 in accordance with aspects of the present technique.
Figure 6:
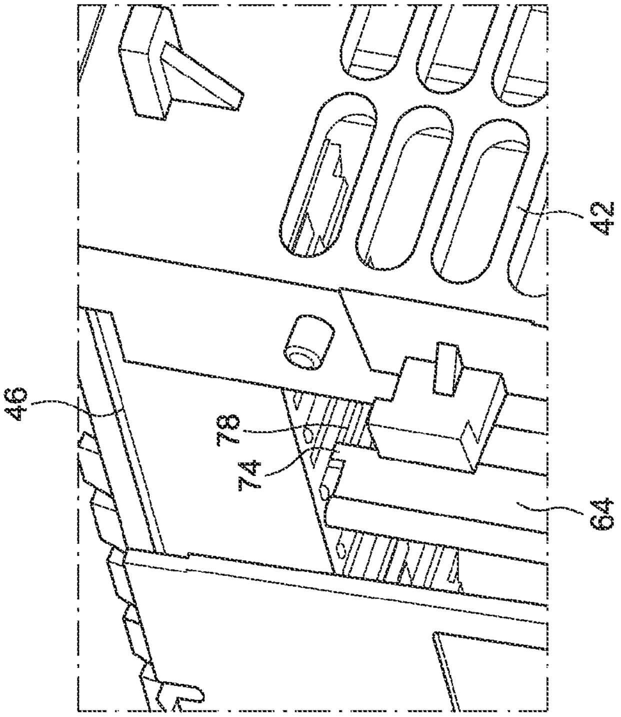
FIG. 6 illustrates engagement of the first support member of the device housing of FIG. 4 with the connector of FIG. 5 in accordance with aspects of the present technique.

FIGS. 6 and 7 illustrate engagement of the first and second support members 64 and 70 with the connector 46. As illustrated, the first attachment feature 74 of the first support member 64 engages with the second attachment feature 78 of the connector 46. In the illustrated embodiment, the engagement of the first attachment feature 74 with the second attachment feature 78 of the connector results in constraining the lateral movement of the first support member 64 and does not allow any eccentric load to be transferred from the connector 46 to the first support member 64. Advantageously, this facilitates the support member 64 to function as an effective support column to resist the movement of the connector 64 towards the base 62 of the device housing 40. In this example embodiment, the first attachment feature 74 includes a pin configured to engage with the receptacle 78 formed on a corresponding location on a bottom surface of the connector 46. However, other engagement mechanisms may be employed.

As illustrated in FIG. 7, the second support member 70 includes the horizontal extension 80 and the vertical extension 82 configured to engage with edges of the connector 46 such that the movement of the connector 46 toward the second support member 70 is resisted by the second support member 70. In certain embodiments, the shape and dimensions of the first and second support members 64 and 70 are selected based upon an expected overturning moment. As described above, the first support member 64 includes a beam extending along the length of the device housing 42 from the base 62 and including the first attachment feature 74. Similarly, the second support member 70 includes a vertical beam extending from at least a side of the device housing 42 with the horizontal extension 80 and the vertical extension 82 configured to support the connector 46 near a distal end of the connector 64. In certain embodiments, both first and second support members 64 and 70 may include beams having other suitable cross-sections and engagement features configured to support and engage the connector 46.

Figure 8:
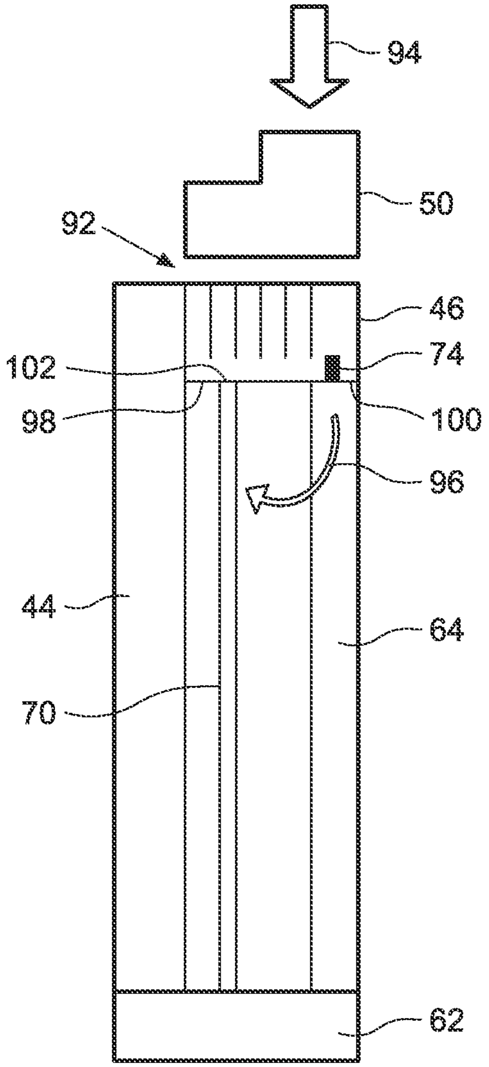
FIG. 8 is a schematic side view of a module that illustrates exemplary forces resisted by the first and second support members of the module of FIG. 2 in accordance with aspects of the present technique.

FIG. 8 illustrates a schematic side view of the module 40 in accordance with present embodiments, wherein exemplary forces are resisted by the first and second support members 64 and 70 of the module 40 of FIG. 2. As illustrated, the connector 46 is cantilevered from a side of the printed circuit board 44 and is supported by support members 64 and 70 extending from the base 62 of the device housing 42. In this embodiment, the connector 46 is configured to slideably receive the removable terminal block 50 into a receptacle 92 that opens away from the base of the housing 42. In operation, the removable terminal block 50 is inserted into the connector 46 by a force generally represented by reference numeral 94, which in turn, pushes the connector 46 towards the support member 64 and imparts an overturning force, as indicated by reference numeral 96.

The engagement surface 98 of the connector 46 abuts with corresponding engagement surfaces 100 and 102 of the support members 64 and 70, respectively. The movement of the connector 46 towards the base 62 of the device housing 42 at a first end of the connector 46 is resisted by the support member 64, and at a second end is resisted by the support member 70. As described above, various arrangements of supporting the connector 46 with the first and second support members 64 and 70 may be envisaged. For example, a substantially perpendicular extension from one of the two support members 64 and 70 may be employed to resist the movement of the connector 46.

The various aspects of the structures described hereinabove may be used for supporting connectors of printed circuit boards, such as those typically found components of industrial automation and control systems. As described above, the technique utilizes one or more support members within the device housing with features on mating surfaces of the connector that facilitate securing of the connector to the printed circuit board while resisting excessive overturning loads experienced by the connector.

Advantageously, the one or more support members support the connector as it is assembled in the device housing while eliminating the need of additional fasteners thereby reducing the overall cost of such components. As will be appreciated by those skilled in the art, the above described implementations may be appropriately scaled and/or reinforced based upon the size of the connectors and printed circuit board. The techniques described above provides a connector support system that facilitates transfer of overturning torques experienced by the connector to the one or more support members thereby protecting the printed circuit board from excessive loads and providing substantial cost savings achieved by reduced number of mechanical parts required for the connecting the connector to the printed circuit board.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of operating a connector module comprising:

abutting an engagement surface of a connector cantilevered from a circuit board with corresponding engagement surfaces of first and second support members disposed within a housing, wherein the corresponding engagement surfaces are substantially horizontal and substantially parallel to the engagement surface;

resisting movement of the connector towards a base of the housing through the corresponding engagement surfaces of the first and second support members; and constraining lateral movement of the connector through engaging a receptacle formed on a distal end of the connector with a pin of the first support member.

2. The method of claim 1, comprising receiving the printed circuit board and the connector into the housing.

3. The method of claim 1, wherein the second support member is cantilevered from the base of the housing.

4. The method of claim 1, comprising coupling a lid with the housing such that the circuit board is enclosed by the lid and the housing.

5. The method of claim 1, comprising transferring at least a portion of an overturning force applied to the connector to a base of the housing through at least one of the first or second support members.

6. The method of claim 1, comprising attaching at least one of the first or second support member to the housing.

7. The method of claim 6, comprising coupling the at least one of the first or second support member to a side surface of the housing using an adhesive or a fastener.

8. The method of claim 1, comprising resisting a force applied to the connector as a result of coupling of a removable terminal block to the connector, wherein resisting the force is achieved via transmission of the force via at least one of the first or second support member.

9. The method of claim 1, comprising slideably receiving a removable terminal block into a receptacle of the connector, wherein the receptacle opens away from a base of the housing.

10. The method of claim 1, comprising engaging the connector with an engagement feature at a distal end of at least one of the first and second support members, wherein the at least one of the first and second support members is coupled to a surface of the housing and includes a beam extending along a length of the housing substantially parallel to the printed circuit board.

* * * * *